(12) United States Patent
Nakagawa et al.

(10) Patent No.: US 9,080,065 B2
(45) Date of Patent: Jul. 14, 2015

(54) COMPOSITION FOR FORMING ALUMINUM-CONTAINING FILM, AND METHOD FOR FORMING ALUMINUM-CONTAINING FILM

(71) Applicant: JSR CORPORATION, Tokyo (JP)

(72) Inventors: Hisashi Nakagawa, Tokyo (JP); Tatsuya Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 222 days.

(21) Appl. No.: 13/781,800

(22) Filed: Mar. 1, 2013

(65) Prior Publication Data

US 2013/0230666 A1    Sep. 5, 2013

(30) Foreign Application Priority Data

Mar. 2, 2012  (JP) ................. 2012-046577

(51) Int. Cl.
| | |
|---|---|
| *C09D 7/00* | (2006.01) |
| *C04B 35/111* | (2006.01) |
| *C04B 35/581* | (2006.01) |
| *C04B 35/622* | (2006.01) |
| *C23C 18/12* | (2006.01) |
| *C23C 18/14* | (2006.01) |
| *H01L 21/02* | (2006.01) |
| *C09D 7/12* | (2006.01) |

(52) U.S. Cl.
CPC ............ *C09D 7/1233* (2013.01); *C04B 35/111* (2013.01); *C04B 35/581* (2013.01); *C04B 35/62222* (2013.01); *C09D 7/00* (2013.01); *C23C 18/1204* (2013.01); *C23C 18/125* (2013.01); *C23C 18/1208* (2013.01); *C23C 18/1216* (2013.01); *C23C 18/1233* (2013.01); *C23C 18/1241* (2013.01); *C23C 18/1245* (2013.01); *C23C 18/1275* (2013.01); *C23C 18/1279* (2013.01); *C23C 18/1283* (2013.01); *C23C 18/14* (2013.01); *H01L 21/0234* (2013.01); *H01L 21/0254* (2013.01); *H01L 21/02178* (2013.01); *H01L 21/02282* (2013.01); *H01L 21/02304* (2013.01); *H01L 21/02337* (2013.01); *H01L 21/02381* (2013.01); *H01L 21/02422* (2013.01); *H01L 21/02425* (2013.01); *H01L 21/02538* (2013.01); *H01L 21/02628* (2013.01); *C04B 2235/48* (2013.01)

(58) Field of Classification Search
CPC .............. C04B 35/111; C04B 35/381; C04B 35/62222; C04B 2235/48; C09D 7/00; C09D 7/1223; C23C 18/1204; C23C 18/1208; C23C 18/1233; C23C 18/1241; C23C 18/1245; C23C 18/125; C23C 18/1275; C23C 18/1279; C23C 18/1283; C23C 18/14; H01L 21/02178; H01L 21/02282; H01L 21/02304; H01L 21/02337; H01L 21/0234; H01L 21/02381; H01L 21/02422; H01L 21/02425; H01L 21/02538; H01L 21/0254; H01L 21/02628
See application file for complete search history.

(56) References Cited

U.S. PATENT DOCUMENTS

2007/0015893 A1 *  1/2007  Hakuta et al. .................. 528/34

FOREIGN PATENT DOCUMENTS

| JP | 09-316631 | 12/1997 |
|---|---|---|
| JP | 2001-220294 | 8/2001 |
| JP | 2006-526705 | 11/2006 |
| JP | 2007-210825 | 8/2007 |
| WO | WO 2004/108985 | 12/2004 |

OTHER PUBLICATIONS

Walgenbach et al., "New Molecular Aluminum Chloride Amides . . . ", ZAAC, (Jan. 2015), vol. 641, Issue 2, pp. 394-399, Abstract Only.*

* cited by examiner

*Primary Examiner* — David M Brunsman
(74) *Attorney, Agent, or Firm* — Oblon, McClelland, Maier & Neustadt, L.L.P.

(57) ABSTRACT

A composition for forming an aluminum-containing film includes an organic solvent, and an organic aluminum compound. The organic aluminum compound has a structure represented by a general formula (1). In the general formula (1), each of $R^1$ to $R^6$ is independently a hydrogen atom or a hydrocarbon group, each of $R^1$s, $R^2$s, $R^3$s, $R^4$s, $R^5$s and $R^6$s is identical or different, and optionally each of $R^1$s, $R^2$s, $R^3$s, $R^4$s, $R^5$s or $R^6$s is linked to one another.

(1)

20 Claims, No Drawings

COMPOSITION FOR FORMING ALUMINUM-CONTAINING FILM, AND METHOD FOR FORMING ALUMINUM-CONTAINING FILM

CROSS-REFERENCE TO RELATED APPLICATIONS

The present application claims priority under 35 U.S.C. §119 to Japanese Patent Application No. 2012-046577, filed Mar. 2, 2012. The contents of this application are incorporated herein by reference in their entirety.

BACKGROUND OF THE INVENTION

1. Field of the Invention

The present invention relates to a composition for forming an aluminum-containing film, and a method for forming an aluminum-containing film.

2. Discussion of the Background

Because of its density and excellent insulating properties, aluminum oxide (alumina) is widely used as a protective film and an insulating film in dynamic random access memory (DRAM) and other semiconductor devices. Other applications are being studied, including gap layers and protective films for thin-film magnetic heads, protective films for metal parts, and gas barrier films on plastic films and the like.

Meanwhile, because of its high thermal conductivity and insulating properties, aluminum nitride is being studied for use as a heat-dissipating substrate in semiconductor devices, and also holds promise as an optical material.

Conventionally, sputtering and chemical vapor deposition methods have been widely used as methods for forming aluminum oxide and aluminum nitride.

For example, Japanese Patent Application Publication No. H9-316631 proposes a method for forming an aluminum oxide film by sputtering an aluminum-containing target in a gas containing fluorine atoms.

On the other hand, Japanese Patent Application Publication No. 2001-220294 proposes a film-forming method in which atomic layer epitaxial growth methods are used to form an insulating film formed of alternating layers of aluminum oxide and titanium oxide.

Meanwhile, Japanese Patent Application Publication (Translation of PCT Application) No. 2006-526705 proposes a method for forming an aluminum-containing film (aluminum oxide film, aluminum nitride film or aluminum oxynitride film) on a substrate by CVD using a non-pyrophoric amino aluminum precursor.

In contrast with the aforementioned film-forming methods, a target film can be obtained more easily and with less expensive equipment by using coating methods, in which an aluminum-containing film is obtained by coating and heat-treating a solution of an aluminum-containing compound or polymer as a raw material on a substrate. It is expected that these coating methods will be widely used in the future because they are superior from the standpoint of embedding properties, step coverage and film formation on narrow-trench substrates.

As an example of a coating method, Japanese Patent Application Publication No. 2007-210825 proposes a method for manufacturing an alumina film by coating a compound having an Al—N bond on its skeleton or a solution of this compound on a substrate, and heating it at a temperature range of 50 to 1000° C. in an atmosphere containing an oxygen-containing gas, and describes, as an example of the solution of the compound having an Al—N bond on its skeleton, an example using a solution of an imino alane dissolved in an organic solvent as a composition for forming a film.

SUMMARY OF THE INVENTION

According to one aspect of the present invention, a composition for forming an aluminum-containing film includes an organic solvent, and an organic aluminum compound. The organic aluminum compound has a structure represented by a general formula (1).

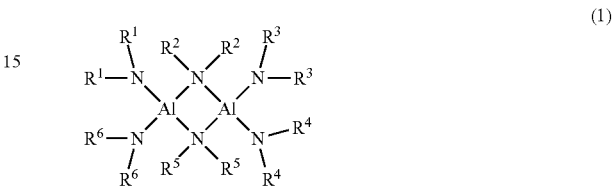

(1)

In the general formula (1), each of $R^1$ to $R^6$ is independently a hydrogen atom or a hydrocarbon group, each of $R^1$s, $R^2$s, $R^3$s, $R^4$s, $R^5$s and $R^6$s is identical or different, and optionally each of $R^1$s, $R^2$s, $R^3$s, $R^4$s, $R^5$s or $R^6$s is linked to one another.

According to another aspect of the present invention, a method for forming an aluminum-containing film includes coating the composition on a substrate to form a coated layer. The coated layer is subjected to heating, electron beam irradiation, ultraviolet irradiation, plasma treatment, or a combination thereof, in an inactive gas or reducing gas atmosphere to cure the coated layer and to form an aluminum nitride film.

According to further aspect of the present invention, a method for forming an aluminum-containing film includes coating the composition on a substrate to form a coated layer. The coated layer is subjected to heating, electron beam irradiation, ultraviolet irradiation, plasma treatment, or a combination thereof, in an oxidizing atmosphere to cure the coated layer and to form an aluminum oxide film.

According to further aspect of the present invention, a method for forming an aluminum-containing film includes coating the composition on a substrate to form a coated layer. The coated layer is subjected to heating, electron beam irradiation, ultraviolet irradiation, plasma treatment, or a combination thereof to form a film containing carbon and aluminum. The film containing carbon and aluminum is subjected to hydrothermal treatment to form an aluminum oxide film.

DESCRIPTION OF THE EMBODIMENTS

The embodiments of the present invention provide [1] to [10] below.

[1] m, A composition for forming an aluminum-containing film, containing an organic solvent and an organic aluminum compound having a structure represented by General Formula (1) below:

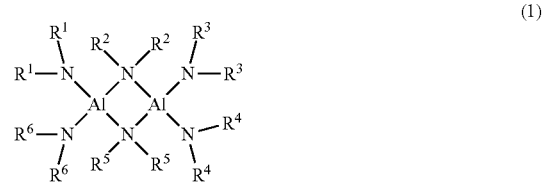

(1)

(in General Formula (1) above, $R^1$ to $R^6$ are hydrogen atoms or hydrocarbon groups, and may be the same or different, and $R''$s (wherein n is an integer from 1 to 6) may be linked to one another).

[2] A method for forming an aluminum-containing film, including a coating step in which the composition for forming an aluminum-containing film according to [1] above is coated on a substrate to form a coated layer, and a curing step in which this coated layer is subjected to a processing including at least one kind of processing selected from the group consisting of heating, electron beam irradiation, ultraviolet irradiation and plasma treatment in an inactive gas or reducing gas atmosphere to thereby form an aluminum nitride film.

[3] The method for forming an aluminum-containing film according to [2] above, wherein the substrate has a substrate body the surface of which has been covered with a film containing aluminum or a transition metal.

[4] A method for forming an aluminum-containing film, including a coating step in which the composition for forming an aluminum-containing film according to [1] above is coated on a substrate to form a coated layer, and a curing step in which this coated layer is subjected to a processing including at least one kind of processing selected from the group consisting of heating, electron beam irradiation, ultraviolet irradiation and plasma treatment in an oxidizing atmosphere to thereby form an aluminum oxide film.

[5] The method for forming an aluminum-containing film according to [4] above, wherein the substrate has a substrate body the surface of which has been covered with a film containing aluminum or a transition metal.

[6] The method for forming an aluminum-containing film according to [4] above, wherein the oxidizing atmosphere is an oxidizing gas atmosphere.

[7] The method for forming an aluminum-containing film according to [6] above, wherein the substrate has a substrate body the surface of which has been covered with a film containing aluminum or a transition metal.

[8] The method for forming an aluminum-containing film according to [4] above, wherein the oxidizing atmosphere is an air atmosphere.

[9] The method for forming an aluminum-containing film according to [8] above, wherein the substrate has a substrate body the surface of which has been covered with a film containing aluminum or a transition metal.

[10] A method for forming an aluminum-containing film, including a coating step in which the composition for forming an aluminum-containing film according to [1] above is coated on a substrate to form a coated layer, a film-forming step in which the coated layer is subjected to a processing including at least one kind of processing selected from the group consisting of heating, electron beam irradiation, ultraviolet irradiation and plasma treatment to thereby form a film containing carbon and aluminum, and a post-processing step in which the film obtained in the film-forming step is subjected to hydrothermal treatment to thereby form an aluminum oxide film.

[11] The method for forming an aluminum-containing film according to [10] above, wherein the substrate has a substrate body the surface of which has been covered with a film containing aluminum or a transition metal.

The composition for forming an aluminum-containing film of the embodiment of the present invention is highly reactive, and allows an aluminum oxide film or aluminum nitride film to be formed more easily and with a higher degree of purity.

The embodiments will now be described in detail. The composition for forming an aluminum-containing film of the embodiment of the present invention contains an organic solvent and an organic aluminum compound having a structure represented by General Formula (1) below:

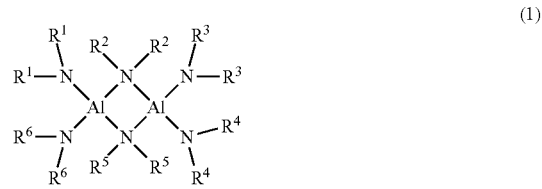

(1)

(in General Formula (1) above, $R^1$ to $R^6$ are hydrogen atoms or hydrocarbon groups, and may be the same or different, and $R''$s (wherein n is an integer from 1 to 6) may be linked to one another).

$R''$s (wherein n is an integer from 1 to 6) that are bound to the same nitrogen atom in General Formula (1) above may also be linked to each other to form a nitrogen-containing cyclic group.

In this description, the lines indicating bonds between atoms in a structural formula do not necessarily represent covalent bonds.

Specific examples of organic aluminum compounds having structures represented by General Formula (1) above include for example organic aluminum compounds represented by General Formula (2) and General Formula (3) below:

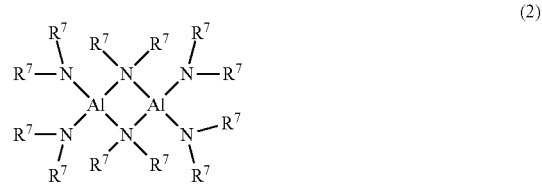

(2)

(in General Formula (2) above, each $R^7$ represents a hydrogen atom or hydrocarbon group, and may be the same or different from the others).

In General Formula (2) above, each $R^7$ is preferably a hydrogen atom or a $C_{1-12}$ monovalent hydrocarbon group, or more preferably a $C_{1-4}$ monovalent hydrocarbon group. A $C_{1-12}$ monovalent hydrocarbon group here may be a branched or an unbranched alkyl, alkenyl, alkynyl or aryl group for example.

Of these, a methyl, ethyl, propyl or isopropyl group is preferred from the standpoint of ease of decomposition of the complex when subjected to heating, electron beam irradiation, ultraviolet irradiation, plasma treatment or the like.

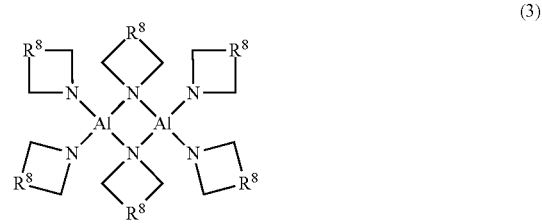

(3)

(In General Formula (3) above, each $R^8$ represents a hydrocarbon group, and may be the same as or different from the others).

In General Formula (3) above, $R^8$ is preferably a $C_{1-12}$ bivalent hydrocarbon group, or more preferably a $C_{1-4}$ bivalent hydrocarbon group. A $C_{1-12}$ bivalent hydrocarbon group here may be a $C_{1-12}$ branched or unbranched alkylene, alkenylene, aralkylene or arylene group for example.

Of these, an ethylene or propylene group is preferred from the standpoint of ease of decomposition of the complex when subjected to heating, electron beam irradiation, ultraviolet irradiation, plasma treatment or the like.

The organic solvent contained in the composition for forming an aluminum-containing film of the embodiment of the present invention is not particularly limited as long as it dissolves the aforementioned organic aluminum compounds without reacting with them. For example, a hydrocarbon solvent, ether solvent or other polar solvent or the like may be used.

Examples of the hydrocarbon solvent include n-pentane, cyclopentane, n-hexane, cyclohexane, n-heptane, cycloheptane, n-octane, cyclooctane, decane, cyclodecane, dicyclopentadiene hydride, benzene, toluene, xylene, durene, indene, tetrahydronaphthalene, decahydronaphthalene, squalane and the like.

Examples of the ether solvent include diethyl ether, dipropyl ether, dibutyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, bis(2-methoxyethyl)ether, p-dioxane, anisole, 2-methylanisole, 3-methylanisole, 4-methylanisole, phentol, 2-methylphentol, 3-methylphentol, 4-methylphentol, veratrole, 2-ethoxyanisole, 1,4-dimethoxybenzene and the like.

Examples of the polar solvent include methylene chloride, chloroform and the like.

These organic solvents may be used individually, or a mixture of two or more kinds may be used.

Of the aforementioned organic solvents, a hydrocarbon solvent or a mixed solvent of a hydrocarbon solvent and an ether solvent is preferred from the standpoint of solubility and stability of the resulting solution. Preferred hydrocarbon solvents are n-pentane, cyclopentane, n-hexane, cyclohexane, n-heptane, cycloheptane, n-octane, n-decane, benzene, toluene or xylene. Preferred ether solvents are diethyl ether, dipropyl ether, dibutyl ether, ethylene glycol diethyl ether, ethylene glycol methyl ethyl ether, tetrahydrofuran, tetrahydropyran, anisole, 2-methylanisole, 3-methylanisole, 4-methylanisole, phentol, veratrole, 2-ethoxyanisole and 1,4-dimethoxybenzene.

<Method for Forming an Aluminum-Containing Film>

One method for forming the aluminum-containing film of the embodiment of the present invention is a method for forming an aluminum-containing film, including a coating step in which the aforementioned composition for forming an aluminum-containing film is coated on a substrate to form a coated layer, and a curing step in which this coated layer is subjected to at least one kind of processing selected from the group consisting of heating, electron beam irradiation, ultraviolet irradiation and plasma treatment in a specific atmosphere to thereby form an aluminum-containing film.

The substance, form and the like of the material constituting the substrate (the substrate body when there is a foundation film as discussed below) are not particularly limited. The material of the substrate is preferably one that can withstand heating treatment when heating treatment is adopted for the step of converting the coated layer to an aluminum-containing film. The substrate on which the coated layer is formed may be in the form of a lump, plate, film or the like, without any particular limitations. The surface of the substrate on which the coated film is formed may be planar, or may be an uneven, non-planar surface. The substrate may also have surface indentations. The concept of "indentations" here includes both wiring gutters or electrode trenches formed on the substrate, and wiring connection holes.

The material of the substrate may be glass, metal, plastic, ceramic or the like for example. Examples of glass include quartz glass, borosilicate glass, soda glass, lead glass and the like. Examples of metals include gold, silver, copper, nickel, silicon, aluminum, iron and the like as well as stainless steel. Examples of plastics include polyimide, polyether sulfone and the like.

The substrate may also has a substrate body the surface of which has been covered with a film (hereunder sometimes called a "foundation film") containing aluminum or a transition metal. The film-forming properties of the aluminum-containing film on the substrate are improved when the substrate has this foundation film.

The aforementioned foundation film is formed by coating the substrate body in advance with a solution (hereunder also called a "foundation film-forming composition") containing an organic metal compound (excluding organic aluminum compounds having the structure represented by General Formula (1) above) that includes at least one kind of metal atoms selected from the group consisting of aluminum and the transition metals, and then heat treating to form the film.

The aforementioned organic metal compound containing aluminum atoms excludes organic aluminum compounds having the structure represented by General Formula (1) above, and examples include aluminum alkoxides, aluminum alkylates, aluminum beta-diketone complexes and the like.

Examples of the aforementioned transition metal include titanium atoms, palladium atoms and the like.

Examples of the organic metal compound containing titanium atoms include titanium alkoxides, titanium compounds having amino groups, titanium beta-diketone complexes, titanium compounds having cyclopentadienyl groups, and titanium compounds having halogen atoms and the like.

Examples of the organic metal compound having palladium atoms include palladium complexes having halogen atoms, palladium acetates, palladium beta-diketone complexes, complexes of palladium with compounds having conjugated carbonyl groups, and palladium phosphine complexes and the like.

Examples of the organic metal compound having aluminum atoms include such aluminum alkoxides as aluminum ethoxide, aluminum isopropoxide, aluminum-n-butoxide, aluminum-s-butoxide, aluminum-t-butoxide, aluminum ethoxyethoxyethoxide, aluminum phenoxide and the like; such aluminum alkylates as aluminum acetate, aluminum acrylate, aluminum methacrylate, aluminum cyclohexane butyrate and the like; and such aluminum beta-diketone complexes as pentane-2,4-diketoaluminum, hexafluoropentane-2,4-diketoaluminum, 2,2,6,6-tetramethylheptane-3,5-diketoaluminum, bis(ethoxybutane-1,3-diketo)aluminum-s-butoxide, (ethoxybutane-1,3-diketo)aluminum di-s-butoxide, (ethoxybutane-1,3-diketo)aluminum diisopropoxide and the like, respectively.

Examples of the organic metal compound having titanium atoms include compounds represented by General Formulae (4) to (8) below for example:

$$Ti(OR^7)_4 \qquad (4)$$

(in General Formula (4) above, $R^7$ is a $C_{1-10}$ alkyl group, phenyl group, halogenated alkyl group or halogenated phenyl group);

$$Ti(OR^8)_xL_{4-x} \tag{5}$$

(in General Formula (5) above, $R^8$ is the same as $R^7$ in General Formula (4); L is a group represented by General Formula (9) below, in which $R^9$ and $R^{10}$ may be the same or different, and each is a $C_{1-10}$ alkyl group, phenyl group, alkoxy group, halogenated alkyl group or halogenated phenyl group; and x is an integer from 0 to 3):

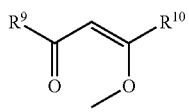
(9)

$$Ti(OR^{11})_y(X)_4 \tag{6}$$

(in General Formula (6) above, $R^{11}$ is an alkyl group or phenyl group, X is a halogen atom, and y is an integer from 0 to 3);

$$Ti(NR^{12})_4 \tag{7}$$

(in General Formula (7) above, $R^{12}$ is an alkyl group or phenyl group);

$$Ti(Cp)_n(Y)_{4-n} \tag{8}$$

(in General Formula (8) above, Cp is a cyclopenadienyl group, Y is a halogen atom or alkyl group, and n is an integer from 1 to 4).

In General Formulae (4) and (5) above, $R^7$ and $R^8$ are each preferably a methyl group, ethyl group, n-propyl group, i-propyl group, n-butyl group, t-butyl group, methoxy group, ethoxy group, n-propoxy group, i-propoxy group, n-butoxy group, t-butoxy group, hexyl group, cyclohexyl group, phenoxy group, methylphenoxy group or trifluoromethyl group, or more preferably a methyl group, ethyl group, n-propyl group, i-propyl group, n-butyl group, t-butyl group, hexyl group, cyclohexyl group or phenyl group.

In General Formula (9) above, $R^9$ and $R^{10}$ are each preferably a methyl group, ethyl group, n-propyl group, i-propyl group, n-butyl group, t-butyl group, methoxy group, ethoxy group, n-propoxy group, i-propoxy group, n-butoxy group, t-butoxy group, phenoxy group, methylphenoxy group or trifluoromethyl group, or more preferably a methyl group, ethyl group, i-propyl group, t-butyl group, methoxy group, ethoxy group, i-propoxy group, t-butoxy group or trifluoromethyl group.

Examples of the titanium compound represented by General Formula (4) above include titanium methoxide, titanium ethoxide, titanium-n-propoxide, titanium-n-nonyl oxide, titanium stearyl oxide, titanium isopropoxide, titanium-n-butoxide, titanium isobutoxide, titanium-t-butoxide, titanium trimethylsiloxide, titanium-2-ethylhexoxide, titanium methoxypropoxide, titanium phenoxide, titanium methylphenoxide, titanium fluoromethoxide, titanium chlorophenoxide and the like.

Examples of the titanium compound represented by General Formula (5) above include tetrakis(penta-2,4-diketo) titanium, tetrakis(2,2,6,6-tetramethylhepta-3,5-diketo) titanium, tetrakis(1-ethoxybutane-1,3-diketo) titanium, tetrakis (1,1,1,5,5,5-hexafluoropenta-2,4-diketo) titanium, (2,2-dimethylhexa-3,5-diketo) titanium, bis(penta-2,4-diketo) titanium dimethoxide, bis(2,2,6,6-tetramethylhepta-3,5-diketo) titanium dimethoxide, bis(1-ethoxybutane-1,3-diketo) titanium dimethoxide, bis(1,1,1,5,5,5-hexafluoropenta-2,4-diketo) titanium dimethoxide, (2,2-dimethylhexa-3,5-diketo) titanium dimethoxide, bis(penta-2,4-diketo) titanium di-1-propoxide, bis(2,2,6,6-tetramethylhepta-3,5-diketo) titanium di-1-propoxide, bis(1-ethoxybutane-1,3-diketo) titanium di-1-propoxide, bis(1,1,1,5,5,5-hexafluoropenta-2,4-diketo) titanium di-1-propoxide, (2,2-dimethylhexa-3,5-diketo) titanium di-1-propoxide and the like.

Examples of the titanium compound represented by General Formula (6) above include trimethoxy titanium chloride, triethoxy titanium chloride, tri-n-propoxy titanium chloride, tri-1-propoxy titanium chloride, tri-n-butoxy titanium chloride, tri-t-butoxy titanium chloride, triisostearoyl titanium chloride, dimethoxy titanium dichloride, diethoxy titanium dichloride, di-n-propoxy titanium dichloride, di-t-propoxy titanium dichloride, di-n-butoxy titanium dichloride, di-t-butoxy titanium dichloride, diisostearoyl titanium dichloride, methoxy titanium trichloride, ethoxy titanium trichloride, n-propoxy titanium trichloride, i-propoxy titanium trichloride, n-butoxy titanium trichloride, t-butoxy titanium trichloride, isostearoyl titanium trichloride, titanium tetrachloride and the like.

Examples of the titanium compound represented by General Formula (7) above include tetrakis(dimethylamino) titanium, tetrakis(diethylamino) titanium, tetrakis(di-t-butoxyamino) titanium, tetrakis(di-i-propoxyamino) titanium, tetrakis(diphenylamino) titanium and the like.

Examples of the titanium compound represented by General Formula (8) above include dicyclopentadienyl titanium dichloride, dicyclopentadienyl titanium dibromide, cyclopentadienyl titanium trichloride, cyclopentadienyl titanium tribromide, dicyclopentadienyl dimethyl titanium, dicyclopentadienyl diethyl titanium, dicyclopentadienyl di-t-butyl titanium, dicyclopentadienyl phenyl titanium chloride, dicyclopentadienyl methyl titanium chloride and the like.

Examples of the organic metal compound containing palladium atoms include palladium complexes having halogen atoms, such as allyl palladium chloride, dichlorobis(acetonitrile) palladium, dichlorobis(benzonitrile) palladium and the like; palladium acetates such as palladium acetate and the like; palladium beta-diketone complexes such as pentane-2,4-dionato palladium, hexafluoropentane dionato palladium and the like; complexes of palladium and compounds having conjugated carbonyl groups, such as bis(dibenzylideneacetone) palladium and the like; and palladium phosphine complexes such as bis[1,2-bis(diphenylphosphino)ethane]palladium, bis(triphenylphosphine) palladium chloride, bis (triphenylphosphine) palladium acetate, diacetatobis (triphenylphosphine) palladium, dichloro[1,2-bis (diphenylphosphine)ethane]palladium, trans-dichlorobis (tricyclohexylphosphine) palladium, trans-dichlorobis (triphenylphosphine) palladium, trans-dichlorobis(tri-o-tolylphosphine) palladium, tetrakis(triphenylphosphine) palladium and the like, respectively.

Of the organic metal compounds described above, titanium isopropoxide, aluminum isopropoxide, bis(ethoxybutane-1,3-diketo) titanium diisopropoxide, tetra(pentane-2,4-diketo) titanium, pentane-2,4-diketopalladium, hexafluoropentane-2,4-diketopalladium, pentane-2,4-diketoaluminum or hexafluoropentane-2,4-diketoaluminum is preferred.

Any solvent can be used as the solvent for dissolving these organic metal compounds containing at least one kind of metal atoms (for example, titanium, palladium or the like) selected from the group consisting of aluminum and the transition metals, as long as it is capable of dissolving the organic metal compounds. Examples of these solvents include ethers, esters having ether groups, hydrocarbons, alcohols, aprotic polar solvents and the like, and mixed solvents of these.

Examples include tetrahydrofuran, dioxane, ethylene glycol dimethyl ether, ethylene glycol diethyl ether, diethylene glycol dimethyl ether, diethylene glycol diethyl ether and the like as ethers; ethylene glycol monomethyl ether acetate, ethylene glycol monoethyl ether acetate, propylene glycol monomethyl ether acetate, propylene glycol monoethyl ether acetate, 2-acetoxy-1-methoxypropane and the like as esters having ether groups; toluene, xylene, hexane, cyclohexane, octane, decalin, tetralin, durene and the like as hydrocarbons; methanol, ethanol, propanol and the like as alcohols; and N-methylpyrrolidone, N,N-dimethylformamide, N,N-dimethylacetamide, hexamethylphosphoramide, gamma-butyrolactone and the like as aprotic polar solvents.

The content of the organic metal compound in the solution is preferably 0.1 to 10 mass % or more preferably 0.1 to 5 mass %. The water and oxygen are preferably removed from the solvent before use.

These foundation film-forming compositions can be coated on the substrate body by a suitable method such as spin coating, roll coating, curtain coating, dip coating, spraying, drop ejection or the like for example.

When the substrate body has a trench structure, if the aperture width is 300 nm or less and the aspect ratio of the trench is 5 or more, the foundation film-forming composition can be coated more uniformly inside the trenches by first coating the foundation film-forming composition on the substrate body, and then leaving the substrate briefly under a pressure lower than the environmental pressure during coating. Specifically, the foundation film-forming composition is held on the substrate at a pressure (hereunder sometimes called a "second pressure") that is lower than the pressure (hereunder sometimes called the "first pressure") during coating of the substrate body having trenches. The second pressure is preferably 1 to 70% or more preferably 10 to 40% of the first pressure. For example, if the pressure during coating is $1.01 \times 10^5$ Pa (normal pressure), the second pressure is preferably $1.01 \times 10^3$ to $7.09 \times 10^4$ Pa, or more preferably $1.01 \times 10^4$ to $4.05 \times 10^4$ Pa. The time during which the substrate is held at the second pressure is preferably 10 seconds to 10 minutes, or more preferably 10 seconds to 1 minute. After the substrate is held at the second pressure, the pressure is preferably restored with inactive gas before the following heating step, and this series of operations including reducing the pressure, holding at the same pressure and then restoring the pressure can be repeated multiple times. The pressure rising time for returning from the second pressure to the first pressure is preferably 3 seconds to 5 minutes, or more preferably 5 seconds to 1 minute. The number of repetitions is preferably 10 or less from the standpoint of film uniformity and workability, or 5 times or less from the standpoint of workability. The formed foundation film is then heated. The heating temperature is preferably 30 to 350° C. or more preferably 40 to 300° C. The heating time is preferably 5 to 90 minutes, or more preferably 10 to 60 minutes. The atmosphere surrounding the film from the coating step to completion of the heating step is preferably an inactive gas such as nitrogen, helium, argon or the like. A reducing gas such as hydrogen or an oxidizing gas such as oxygen can also be mixed into the atmosphere as necessary.

The thickness of these foundation films after heat treating is preferably 0.001 to 5 µm, or more preferably 0.005 to 0.5 µm.

A suitable method such as spin coating, roll coating, curtain coating, dip coating, spraying, drop ejection or the like can be used as the method for coating the composition for forming an aluminum-containing film of the embodiment of the present invention on the substrate described above. In these coating steps, the coating conditions can be selected according to the shape, size and the like of the substrate so that the composition for forming an aluminum-containing film covers every part of the substrate. For example, if spin coating is adopted as the coating method, the rotational frequency of the spinner is preferably 300 to 2500 rpm, or more preferably 500 to 2000 rpm. When the substrate has indentations, the environmental pressure may also be varied after coating as discussed above with reference to coating the foundation film-forming composition.

After this coating step, heat treatment may also be performed to remove low-boiling-point components such as solvent which is contained in the coated composition for forming the aluminum-containing film. The heating temperature and time differ depending on the type and boiling point (steam pressure) of the solvent used, but for example a temperature of 100 to 350° C. and a time of 5 to 90 minutes can be used. In this case, the solvent can be removed at a lower temperature if the entire system is depressurized. The conditions for heat treatment under reduced pressure are preferably 100 to 250° C. and 10 to 60 minutes.

Next, the coated layer formed by the method described above is subjected to at least one kind of processing selected from the group consisting of heating, electron beam irradiation, ultraviolet irradiation and plasma treatment in a specific atmosphere to thereby form an aluminum-containing film on the substrate.

The aluminum-containing film formed on the substrate is an aluminum oxide film or aluminum nitride film. Moreover, this aluminum-containing film does not contain metal aluminum.

Moreover, either aluminum-containing film (aluminum oxide film, aluminum nitride film) can be formed on the substrate by using a specific atmosphere as the atmosphere for performing the heating, electron beam irradiation, ultraviolet irradiation or plasma treatment.

Specifically, a high-purity aluminum oxide film can be obtained by performing heat treatment or the like in an oxidizing atmosphere.

This oxidizing atmosphere may be an oxidizing gas atmosphere, air atmosphere or the like. Of these, air atmosphere is preferred from the standpoint of ease of operation and economy.

The oxidizing gas may be oxygen, ozone, oxygen radicals, carbon dioxide, nitrogen dioxide, water vapor or the like. Of these, water vapor is preferred from the standpoint of economy.

Moreover, a high-purity aluminum nitride film can be obtained by performing heat treatment or the like in an inactive gas atmosphere or reducing gas atmosphere.

The inactive gas may be nitrogen, helium, argon or the like. The reducing gas may be hydrogen, ammonia or the like. Of these, heating or the like in an ammonia atmosphere is desirable for obtaining a higher degree of purity.

The temperature for performing heat treatment is preferably 60° C. or more, or more preferably 70 to 600° C., or most preferably 100 to 500° C. The heating time is preferably 30 seconds to 120 minutes, or more preferably 1 to 90 minutes, or most preferably 10 to 60 minutes.

The film-forming step discussed below can also be performed before the curing step, in which case the curing step is then performed on a film containing carbon and aluminum rather than on a coated layer.

Another method for forming the aluminum-containing film of the embodiment of the present invention is a method for forming an aluminum-containing film, including a coating step in which the composition for forming an aluminum-containing film is coated on the aforementioned substrate to thereby form a coated layer, a film-forming step in which the coated layer is subjected to at least one kind of processing selected from the group consisting of heating, electron beam irradiation, ultraviolet irradiation and plasma treatment to thereby form a film containing carbon and aluminum, and a post-processing step in which the film obtained in the film-forming step is subjected to hydrothermal treatment to thereby form an aluminum oxide film.

A film containing aluminum and a small amount of carbon can be formed on a substrate by means of the film-forming step.

The atmosphere for performing the film-forming step is not particularly limited, and the step can be performed in the oxidizing atmosphere or in an inactive gas atmosphere or reducing gas atmosphere described above, for example. Of these, an inactive gas atmosphere is preferred. Of the inactive gasses, nitrogen is preferred.

The temperature for performing heat treatment in the film-forming step is preferably 60° C. or more, or more preferably 70 to 600° C., or most preferably 100 to 500° C. The heating time is preferably 30 seconds to 120 minutes, or more preferably 1 to 90 minutes, or most preferably 10 to 60 minutes.

A high-purity aluminum oxide film can be formed on the substrate by subjecting the film obtained in the film-forming step to hydrothermal treatment.

Hydrothermal treatment here is treatment performed under high-temperature, high-pressure conditions (100° C., pressure above 1 atmosphere) in the presence of highly reactive water.

Specifically, a substrate with a formed film containing aluminum and a small amount of carbon is heat treated for 2 to 5 hours with an autoclave or the like at a temperature of 100 to 300° C. or preferably 130 to 250° C. The pressure conditions are in excess of 1 atmosphere, or preferably 2 to 3 atmospheres. An aluminum-containing film consisting of aluminum oxide on a substrate can be obtained by performing hydrothermal treatment under these conditions.

A basic compound can also be added as a catalyst when performing hydrothermal treatment. Examples of the basic compound include amines, ammonia, sodium hydroxide, potassium hydroxide and the like. Of these, amines and ammonia are preferred because they are volatile and easy to remove, and ammonia is especially preferred.

When using ammonia as the basic compound, the content of the ammonia is preferably 0.0001 to 100 mass parts or more preferably 0.1 to 50 mass parts per 100 mass parts of the composition for forming an aluminum-containing film.

EXAMPLES

The present invention is explained in detail below using examples, but the present invention is not limited to these examples. Unless specifically mentioned, the following operations were all performed in a dry nitrogen atmosphere. The solvents used were all dehydrated in advance in a 4A molecular sieve (UNION SHOWA K.K.), and deaerated by bubbling with nitrogen gas.

The "%" values below are all based on mass unless otherwise specified.

Synthesis Example 1

100 ml (0.20 mol) of a THF solution containing dimethylamide in the amount of 2.0 mol/L was added to a three-necked flask, and diluted by addition of 200 ml of THF. This diluted solution was cooled to −40° C., and 125 ml (0.20 mol) of a hexane solution containing 1.6 mol/L of n-butyl lithium was added over the course of 30 minutes to obtain a lithium dimethylamide solution. 8.9 g (0.067 mol) of aluminum chloride was added to a separate flask, and 60 ml of THF and 60 ml of diethyl ether were added in that order to dissolve the aluminum chloride, yielding an aluminum chloride solution. The lithium dimethylamide solution was cooled in an ice bath as the previously-prepared aluminum chloride solution was added over the course of 30 minutes. This was then agitated for 3 hours at room temperature, and vacuum concentrated to remove all of the solvent. The solid remaining in the flask was extracted with 200 ml of hexane and filtered, and the filtrate was vacuum concentrated again to yield 10.4 g of a yellowish-white solid substance. The results of NMR and elemental analysis confirmed that this substance was a compound having the following structure. The yield was 97%.

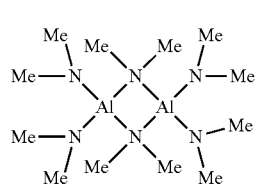

(4)

(In the compound having this formula, "Me" is a methyl group).

Synthesis Example 2

0.51 g (0.014 mol) of lithium aluminum hydride and 130 ml of diethyl ether were added to a three-necked flask, to obtain a suspension. A solution of 4.92 g (0.070 ml) of pyrrolidine mixed with 50 ml of diethyl ether was added to this suspension at room temperature. After addition, the mixture was agitated at room temperature for 2 hours, and vacuum concentrated to remove the solvent. This was then re-dissolved by addition of 80 ml of THF to the flask, and a solution of 0.60 g (0.0046 mol) of aluminum chloride mixed and dissolved with 16 ml of THF and 8 ml of diethyl ether was added at room temperature. After addition, this was agitated at room temperature for 6 hours, vacuum concentrated to remove the solvent, and extracted by addition of 80 ml of toluene. The insoluble component was removed by filtration, and the filtrate was vacuum concentrated to yield 3.5 g of a yellowish-white solid substance. The results of NMR and elemental analysis confirmed that this substance was a compound having the following structure. The yield was 80%.

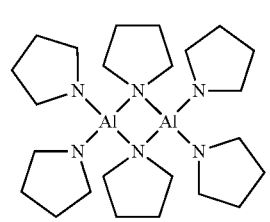

(5)

Synthesis Example 3

3.80 g of lithium aluminum hydride was loaded into a 200 mL three-necked flask containing a magnetic stirrer. A 100 mL powder addition funnel, a three-way adapter connected to a nitrogen gas flow, and a glass stopper were attached, respectively, to the three connecting ports of the three-necked flask. 17.80 g of a triethylamine hydrochloric acid salt was loaded into the powder addition funnel, after which the three-necked flask was placed under a nitrogen seal via the three-way adapter.

100 mL of hexane was added to the three-necked flask with a glass syringe. This was stirred at 1000 rpm with the magnetic stirrer as the triethylamine hydrochloride acid salt was dripped gradually into the three-necked flask over the course of 10 minutes, and agitation was continued for a further 2 hours.

Next, using a polytetrafluoroethylene tube with the tip packed with absorbent cotton (Japanese Pharmacopoeia absorbent cotton), the reaction mixture was transferred by pressure feed to a separate container, and filtered with a polytetrafluoroethylene membrane filter with a pore diameter of 0.1 μm (Whatman Inc.). The filtrate was received in a 300 mL eggplant-shaped flask, a magnetic stirrer was inserted after completion of filtration, and a three-way vacuum adapter was mounted.

This three-way vacuum adapter was connected via a trap to a vacuum pump, and the solvent was removed under reduced pressure as the mixture was agitated at 300 rpm with the magnetic stirrer. After removal of the solvent, the residue was filtered with a polytetrafluoroethylene membrane filter with a pore diameter of 0.1 μm (Whatman Inc.) to obtain 10.25 g of a complex of triethylamine and aluminum chloride as a colorless transparent liquid. The yield was 55%.

Synthesis Example 4

5 g of lithium aluminum hydride was suspended in benzene (80 ml) and cooled to 5° C., and a mixture of methylamine hydrochloride and ethylamine hydrochloride that had been vacuum dried in advance for 2 hours was added. The molar ratio of the methylamine hydrochloride and ethylamine hydrochloride added here was 3:1. Moreover, the amount of the mixture of methylamine hydrochloride and ethylamine hydrochloride relative to the lithium aluminum hydride was such as to obtain a molar ratio of 1:1 relative to the lithium aluminum hydride. This was agitated for 1 hour at 5° C., and the temperature of the suspension was gradually raised to 80° C. This was then maintained near 50° C. for about 1 hour. After 18 hours of reflux at 80° C., a sediment containing lithium chloride and reaction products as insoluble matter was removed by filtration, and the benzene was removed from the filtrate under reduced pressure to yield 7.5 g of a mixture of methyliminoalane and ethyliminoalane as a white solid. The yield was 94%.

[Preparation of Composition for Forming Foundation Film]

0.30 g of bis(penta-2,4-diketo titanium (IV) diisopropoxide and 64 μL of tetrakis(dimethylamino) titanium were taken in a 20 mL glass container, and propylene glycol monomethyl ether acetate was added, bringing the total of the mixture to 18.00 g. The mixture was thoroughly agitated, and left standing for 2 hours at room temperature. This was then filtered with a polytetrafluoroethylene membrane filter with a pore diameter of 0.1 μm (Whatman Inc.) to obtain a composition for forming the foundation film.

[Preparation of Composition for Forming Aluminum-Containing Film]

(1) Preparation of Composition A for Forming Aluminum-Containing Film 8.0 g of decane was added to 2.0 g of the aluminum complex obtained in Synthesis Example 1, and the mixture was thoroughly agitated and left standing for 2 hours at room temperature. This was then filtered with a polytetrafluoroethylene membrane filter with a pore diameter of 0.1 μm (Whatman Inc.) to obtain a Composition A for forming an aluminum-containing film.

(2) Preparation of Composition B for Forming Aluminum-Containing Film 8.0 g of 4-methylanisole was added to 2.0 g of the aluminum complex obtained in Synthesis Example 2, and the mixture was thoroughly agitated and left standing for 2 hours at room temperature. This was then filtered with a polytetrafluoroethylene membrane filter with a pore diameter of 0.1 μm (Whatman Inc.) to obtain a Composition B for forming an aluminum-containing film.

(3) Preparation of Composition C for Forming Aluminum-Containing Film 9.0 g of 4-methylanisole was added to 1.0 g of the aluminum complex obtained in Synthesis Example 3, and the mixture was thoroughly agitated and left standing for 2 hours at room temperature. This was then filtered with a polytetrafluoroethylene membrane filter with a pore diameter of 0.1 μm (Whatman Inc.) to obtain a Composition C for forming an aluminum-containing film.

(4) Preparation of Composition D for Forming Aluminum-Containing Film 9.0 g of toluene was added to the iminoalane mixture obtained in Synthesis Example 4, and the mixture was thoroughly agitated and left standing for 2 hours at room temperature. This was then filtered with a polytetrafluoroethylene membrane filter with a pore diameter of 0.1 μm (Whatman Inc.) to obtain a Composition D for forming an aluminum-containing film.

Formation of an Aluminum-Containing Film

Example 1

(1) A 4-inch silicon substrate was mounted on a spin coater, 1 mL of the aforementioned composition for forming a foundation film was dripped in a nitrogen gas atmosphere, and the substrate was spun for 10 seconds at 3000 rpm. This substrate was placed on a hot plate set to 150°, and heated for 2 minutes. The thickness of the foundation film was 5 nm.

(2) This substrate was then mounted again on the spin coater in a nitrogen atmosphere, 2.5 g of the aforementioned Composition A for forming an aluminum-containing film was dripped in, and the substrate was spun for 10 seconds at 1400 rpm. The substrate was heated for 5 minutes on a 150° hot plate.

(3) This substrate was then heated for 1 hour at 500° C. in a furnace in a nitrogen atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 2

A substrate obtained by procedures similar to those of (1) and (2) in Example 1 was heated for 1 hour at 500° C. in a furnace in an ammonia gas atmosphere (760 torr).

The film thickness of the resulting film was analyzed with a cross-sectional scanning electron microscope (SEM), and the composition of the film was analyzed by Rutherford backscattering analysis spectrometry (RBS analysis). The results are shown in Table 1.

Example 3

A substrate obtained by procedures similar to those of (1) and (2) in Example 1 was heated for 1 hour at 500° C. in a furnace in an air atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 4

A substrate obtained by procedures similar to those of (1) and (2) in Example 1 was heated for 1 hour at 500° C. in a water vapor atmosphere (760 torr).

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 5

A substrate obtained by procedures similar to those of (1) and (2) in Example 1 was placed in a sealed pressure-resistant container containing 100 g of 10% $NH_3$ aqueous solution, and introduced into a furnace with a 170° C. atmosphere to thereby perform hydrothermal treatment by exposing the substrate for 3 hours under pressure from ammonia vapor and water vapor generated inside the container.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 6

(1) A 4-inch silicon substrate was placed on a hot plate set at 150° C., and heated for 2 minutes to remove moisture adsorbed on the surface.

(2) This substrate was then mounted on a spin coater in a nitrogen atmosphere, 2.5 g of the Composition B for forming an aluminum-containing film were dripped in, and the substrate was spun for 10 seconds at 1400 rpm. This substrate was then heated for 5 minutes on a 150° C. hot plate.

(3) The substrate was then heated for 1 hour at 500° C. in a furnace in a nitrogen atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 7

A substrate obtained by procedures similar to those of (1) and (2) in Example 6 was heated for 1 hour at 500° C. in a furnace in an ammonia gas atmosphere (760 torr).

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 8

A substrate obtained by procedures similar to those of (1) and (2) in Example 6 was heated for 1 hour at 500° C. in a furnace in an air atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 9

A substrate obtained by procedures similar to those of (1) and (2) in Example 6 was heated for 1 hour at 500° C. in a water vapor atmosphere (760 torr).

The film thickness of the resulting film was analyzed with a cross-sectional scanning electron microscope (SEM), and the composition of the film was analyzed by Rutherford backscattering spectrometry analysis (RBS analysis). The results are shown in Table 1.

Example 10

A substrate obtained by procedures similar to those of (1) and (2) in Example 6 was placed in a sealed pressure-resistant container containing 100 g of 10% $NH_3$ aqueous solution, and introduced into a furnace with a 170° C. atmosphere to thereby perform hydrothermal treatment by exposing the substrate for 3 hours under pressure from ammonia vapor and water vapor generated inside the container.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Comparative Example 1

(1) A 4-inch silicon substrate was mounted on a spin coater, 1 mL of the aforementioned composition for forming a foundation film was dripped in a nitrogen gas atmosphere, and the substrate was spun for 10 seconds at 3000 rpm. This substrate was mounted on a hot plate set to 150° C., and heated for 2 minutes. The thickness of the foundation film was 5 nm.

(2) This substrate was then mounted on a spin coater in a nitrogen atmosphere, 2.5 g of the Composition C for forming an aluminum-containing film was dripped in, and the substrate was spun for 10 seconds at 1400 rpm. This substrate was heated for 5 minutes on a 150° C. hot plate.

(3) The substrate was then heated for 1 hour at 500° C. in a furnace in an air atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Comparative Example 2

A substrate obtained by procedures similar to those of (1) and (2) in Comparative Example 1 was placed in a sealed pressure-resistant container containing 100 g of 10% $NH_3$ aqueous solution, and introduced into a furnace with a 170° C. atmosphere to thereby perform hydrothermal treatment by exposing the substrate for 3 hours under pressure from ammonia vapor and water vapor generated inside the container.

The film thickness of the resulting film was analyzed with a cross-sectional scanning electron microscope (SEM), and the composition of the film was analyzed by Rutherford backscattering spectrometry analysis (RBS analysis). The results are shown in Table 1.

Comparative Example 3

(1) A 4-inch silicon substrate was placed on a hot plate set to 150° C., and heated for 2 minutes to remove moisture adsorbed on the surface.

(2) This substrate was then mounted on a spin coater in a nitrogen atmosphere, 2.5 g of the Composition D for forming an aluminum-containing film was dripped in, and the substrate was spun for 10 seconds at 1400 rpm. This substrate was heated for 5 minutes on a 150° C. hot plate.

(3) The substrate was then heated for 1 hour at 500° C. in a furnace in an air atmosphere.

The film thickness of the resulting film was analyzed with a cross-sectional scanning electron microscope (SEM), and the composition of the film was analyzed by Rutherford backscattering spectrometry analysis (RBS analysis). The results are shown in Table 1.

TABLE 1

| | Foundation film (Ti) | Al compound | Heat atmosphere | Film thickness (nm) | Composition (%) | | | |
|---|---|---|---|---|---|---|---|---|
| | | | | | Al | N | C | O |
| Example 1 | present | Synthesis Example 1 | nitrogen | 50 | 30 | 60 | 10 | — |
| Example 2 | present | Synthesis Example 1 | ammonia | 45 | 45 | 55 | — | — |
| Example 3 | present | Synthesis Example 1 | air | 50 | 35 | — | — | 65 |
| Example 4 | present | Synthesis Example 1 | water vapor | 45 | 33 | — | — | 67 |
| Example 5 | present | Synthesis Example 1 | hydrothermal treatment | 45 | 32 | — | — | 68 |
| Example 6 | absent | Synthesis Example 2 | nitrogen | 55 | 25 | 55 | 20 | — |
| Example 7 | absent | Synthesis Example 2 | ammonia | 50 | 40 | 60 | — | — |
| Example 8 | absent | Synthesis Example 2 | air | 55 | 36 | — | — | 64 |
| Example 9 | absent | Synthesis Example 2 | water vapor | 50 | 33 | — | — | 67 |
| Example 10 | absent | Synthesis Example 2 | hydrothermal treatment | 50 | 32 | — | — | 68 |
| Comparative Example 1 | present | Synthesis Example 3 | air | 60 | 35 (upper layer)[1] | — | — | 65 (upper layer) |
| | | | | | 90 (lower layer)[2] | — | — | 10 (lower layer) |
| Comparative Example 2 | present | Synthesis Example 3 | hydrothermal treatment | 50 | 33 | — | — | 67 |
| Comparative Example 3 | absent | Synthesis Example 4 | air | 60 | 50 | 10 | 5 | 35 |

[1] 40 nm from the upper surface of the film
[2] 20 nm from the lower surface of the film The results of Table 1 show that an aluminum nitride film can be obtained using the composition for forming an aluminum-containing film of the embodiment of the present invention when heat treatment is performed in a nitrogen atmosphere or ammonia atmosphere. On the other hand, an aluminum oxide film can be obtained using the composition for forming an aluminum-containing film of the embodiment of the present invention when heat treatment is performed in an air or water vapor atmosphere or when hydrothermal treatment is performed.

Comparing Examples 3 and 8 with Comparative Examples 1 and 3 in particular, a high-purity aluminum oxide film can be obtained using the composition for forming an aluminum-containing film of the embodiment of the present invention even when heat treatment is performed in air, which has relatively weak oxidizing power. This is attributed to the high reactivity of the organic aluminum compound having the structure represented by General Formula (1) above.

Obviously, numerous modifications and variations of the present invention are possible in light of the above teachings. It is therefore to be understood that within the scope of the appended claims, the invention may be practiced otherwise than as specifically described herein.

What is claimed is:

1. A composition for forming an aluminum-containing film, comprising:
   an organic solvent; and
   an organic aluminum compound having a structure represented by formula (1):

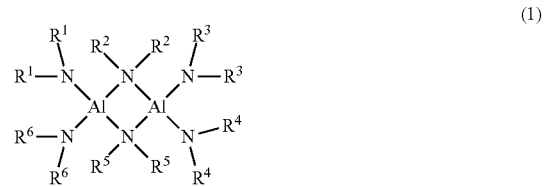

wherein, in formula (1), each of $R^1$ to $R^6$ is independently a hydrogen atom or a hydrocarbon group, each of $R^1$s, $R^2$s, $R^3$s, $R^4$s, $R^5$s and $R^6$s is identical or different, and optionally each of $R^1$s, $R^2$s, $R^3$s, $R^4$s, $R^5$s or $R^6$s is linked to one another.

2. The composition according to claim 1, wherein the organic aluminum compound is represented by formula (2):

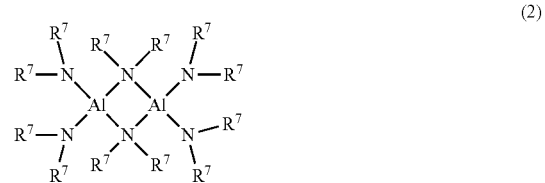

wherein, in formula (2), each $R^7$ represents a hydrogen atom or a monovalent hydrocarbon group having 1 to 12 carbon atoms.

3. The composition according to claim 2, wherein, in formula (2), each $R^7$ represents a monovalent hydrocarbon group having 1 to 4 carbon atoms.

4. The composition according to claim 2, wherein, in formula (2), each $R^7$ represents a methyl group, an ethyl group, a propyl group, or an isopropyl group.

5. The composition according to claim 2, wherein, in formula (2), each $R^7$ represents a methyl group.

6. The composition according to claim 1, wherein the organic aluminum compound is represented by formula (3):

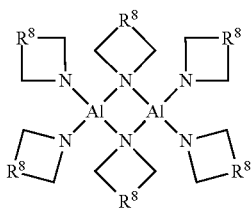

wherein, in formula (3), each $R^8$ represents a bivalent hydrocarbon group having 1 to 12 carbon atoms.

7. The composition according to claim 6, wherein, in formula (3), each $R^8$ represents a bivalent hydrocarbon group having 1 to 4 carbon atoms.

8. The composition according to claim 6, wherein, in formula (3), each $R^8$ represents an ethylene group or a propylene group.

9. The composition according to claim 6, wherein, in formula (3), each $R^8$ represents an ethylene group.

10. The composition according to claim 1, wherein the organic solvent is a hydrocarbon solvent or a mixed solvent of a hydrocarbon solvent and an ether solvent.

11. A method for forming an aluminum-containing film, comprising:
    coating the composition according to claim 1 on a substrate to form a coated layer; and
    subjecting the coated layer to heating, electron beam irradiation, ultraviolet irradiation, plasma treatment, or a combination thereof, in an inactive gas or reducing gas atmosphere to cure the coated layer and to form an aluminum nitride film.

12. The method according to claim 11, wherein the substrate has a substrate body the surface of which has been covered with a film containing aluminum or a transition metal.

13. A method for forming an aluminum-containing film, comprising:
    coating the composition according to claim 1 on a substrate to form a coated layer; and
    subjecting the coated layer to heating, electron beam irradiation, ultraviolet irradiation, plasma treatment, or a combination thereof, in an oxidizing atmosphere to cure the coated layer and to form an aluminum oxide film.

14. The method according to claim 13, wherein the substrate has a substrate body the surface of which has been covered with a film containing aluminum or a transition metal.

15. The method according to claim 13, wherein the oxidizing atmosphere is an oxidizing gas atmosphere.

16. The method according to claim 15, wherein the substrate has a substrate body the surface of which has been covered with a film containing aluminum or a transition metal.

17. The method according to claim 13, wherein the oxidizing atmosphere is an air atmosphere.

18. The method for according to claim 17, wherein the substrate has a substrate body the surface of which has been covered with a film containing aluminum or a transition metal.

19. A method for forming an aluminum-containing film, comprising:
    coating the composition according to claim 1 on a substrate to form a coated layer;
    subjecting the coated layer to heating, electron beam irradiation, ultraviolet irradiation, plasma treatment, or a combination thereof to form a film containing carbon and aluminum; and
    subjecting the film containing carbon and aluminum to hydrothermal treatment to form an aluminum oxide film.

20. The method according to claim 19, wherein the substrate has a substrate body the surface of which has been covered with a film containing aluminum or a transition metal.

* * * * *